United States Patent
Wohlfahrt et al.

(10) Patent No.: US 6,670,549 B1
(45) Date of Patent: Dec. 30, 2003

(54) ELECTRONIC MODULE

(75) Inventors: Karl-Heinz Wohlfahrt, Radolfzell (DE); Horst Singer, Radolfzell (DE)

(73) Assignee: TRW Automotive Electronics & Components GmbH & Co. KG (DE)

(*) Notice: Subject to any disclaimer, the term of this patent is extended or adjusted under 35 U.S.C. 154(b) by 0 days.

(21) Appl. No.: 09/869,100

(22) PCT Filed: Nov. 19, 1999

(86) PCT No.: PCT/DE99/03691
§ 371 (c)(1),
(2), (4) Date: Oct. 12, 2001

(87) PCT Pub. No.: WO00/40066
PCT Pub. Date: Jul. 6, 2000

(30) Foreign Application Priority Data

Dec. 23, 1998 (DE) .......................................... 198 60 035

(51) Int. Cl.[7] .............................................. H01L 23/28
(52) U.S. Cl. ...................... 174/52.2; 361/757; 257/787; 257/788
(58) Field of Search ............................... 174/52.2, 52.3, 174/52.4, 254, 255; 361/752, 757, 760, 762, 765; 257/687, 787, 788; 264/272.11

(56) References Cited

U.S. PATENT DOCUMENTS 4,546,412 A * 10/1985 Nakazawa et al. .......... 361/743
5,699,232 A * 12/1997 Neidig et al. ............... 361/752

FOREIGN PATENT DOCUMENTS

| DE | 37 02 782 A1 | 10/1987 | |
|---|---|---|---|
| EP | 473242 A1 * | 3/1992 | ............ H05K/5/00 |
| EP | 0 414 138 B1 | 11/1994 | |
| EP | 0 473 242 B1 | 4/1995 | |
| EP | 0 832 936 A1 | 4/1998 | |

* cited by examiner

Primary Examiner—Anthony Dinkins
Assistant Examiner—Carmelo Oliva
(74) Attorney, Agent, or Firm—Fay, Sharpe, Fagan, Minnich & McKee, LLP

(57) ABSTRACT

The invention relates to an electronic module consisting of electrical circuit board conductors (3a), one or more electronic and/or electromechanical components (5, 5'), and one or more electrical connection contacts (7) wherein the circuit board conductors (3a) and the components (5, 5') are surrounded at least partially by a plastic material (11) having low Shore Hardness.

11 Claims, 4 Drawing Sheets

ELECTRONIC MODULE

BACKGROUND OF THE INVENTION

The present invention relates to the electronics arts. It particularly relates to an electronic module for automotive applications as well as to a receiving element with an integrated electronic module therein, and will be described with particular reference thereto. However, the invention also finds application in electronic modules of other types and for other uses.

It is known to check for proper locking in an automotive seat belt restraining system by means of a terminal switch disposed inside the lock. The switch detects when the belt locking element is inserted into the lock. The terminal switch thus monitors whether the seated person has closed the belt correctly. In the event the lock is incorrectly engaged, an alarm or other warning signal can be generated.

Recently, however, there has been a demand in the automotive industry for improved vehicle safety. This demand has generated a desire to recognize malfunctions of the device that monitors the locking of the seat belt lock. In particular, such monitoring is desirable when the locking information is used for selectively controlling the activation of one or more airbags. For example, it is possible to selectively control the chronological order of airbag activation. It is also possible to control airbag activation with respect to degree of fullness or its filling velocity, depending upon whether or not the person being protected thereby is buckled down.

The monitoring device therefor typically requires the utilization of appropriate electronics.

The installation of such electronics in a seat belt buckle of a car seat belt system, however, poses certain difficulties. The electronics must be integrated into the seat belt buckle typically within an extremely limited space. At the same time, the electronics inside the seat belt buckle must be adequately protected from vibrations, mechanical shocks, and other environmental influences which typically occur in a motor vehicle.

SUMMARY OF THE INVENTION

In accordance with the invention, an electronic module is provided which, given positive and non-positive integration, is adequately protected from vibrations and mechanical shocks as well as other environmental influences. The electronic module is preferably manufacturable at a low cost. In another embodiment, the electronic module is integrated into a receiving element, in particular a belt buckle for a seat belt, which satisfies the aforementioned requirements.

By invention-specific enveloping of the electrical circuit-board conductors and the electronic and electromechanical components within a plastic material having low Shore Hardness, an elastic casing is produced which protects the electronic module from environmental influences. This overall structure combines, as desired, the electronic components and circuit board conductors into a single module. Furthermore, by using the soft plastic casing with positive or non-positive integration of the electronic module into a receiving element, vibrations and mechanical shocks are transmitted only in an attenuated manner to the circuit board conductors, the components, and particularly to the connection sites where the components connect with the circuit board conductors. The module is thus adequately protected from mechanical damage.

The circuit board conductors and components are encased within a relatively soft plastic material which preferably has a Shore Hardness of less than or equal to 60, preferably between 25 and 60 Shore, and most preferably between 40 and 60 Shore. This enables spray-encasement of the circuit board conductors and components in a relatively simple and cost-effective manner.

The components can be arranged, for example, on a stamped grid, a printed circuit board or any other form of circuit board as desired. In the event that a stamped grid is employed, the encasement with the relatively soft plastic material simultaneously provides adequate fixing of the circuit board conductors and components. Modules formed this way are mechanically unstable or flexible overall, but fully electrically functional.

The plastic encasement is formed in such a fashion that at least portions of the plastic are shaped for simple positive and/or non-positive connection with a receiving element. For example, the plastic encasement is selectively provided with suitable projections by means of which the module is securely retained in the receiving element.

According to one embodiment of the invention, the relatively soft plastic sheathing is encased, at least partially, within a covering of rigid plastic, preferably using a spray-encasing process. This provides mechanical stabilization, particularly when the circuit board conductors are formed as a stamped grid. In particular, this arrangement enables simple installation of the module in a receiving element, for example via snap-in connections, welding, e.g. ultra-sound welding, screw-fastening, or the like.

In another embodiment of the invention, the receiving element having the electronic module integrated therein is injecting or poured with its relatively soft plastic covering into a receiving element. This results, just as with installation of a module having an additional hard plastic casing, in a flexible or resilient bedding of the electronic module in the receiving element.

In an additional embodiment, the electronic module with its circuit board connectors or printed circuit board are fixed directly into the receiving element at one or several locations as desired. Preferably, the circuit board connectors or printed circuit board are not connected to the receiving element to the extent that the circuit board conductors overall are rigidly retained in the module. Additionally, this arrangement provides adequate resilient and/or vibration-attenuating bedding of the essential components of the electronics, in particular the electronic components of the electronic module.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
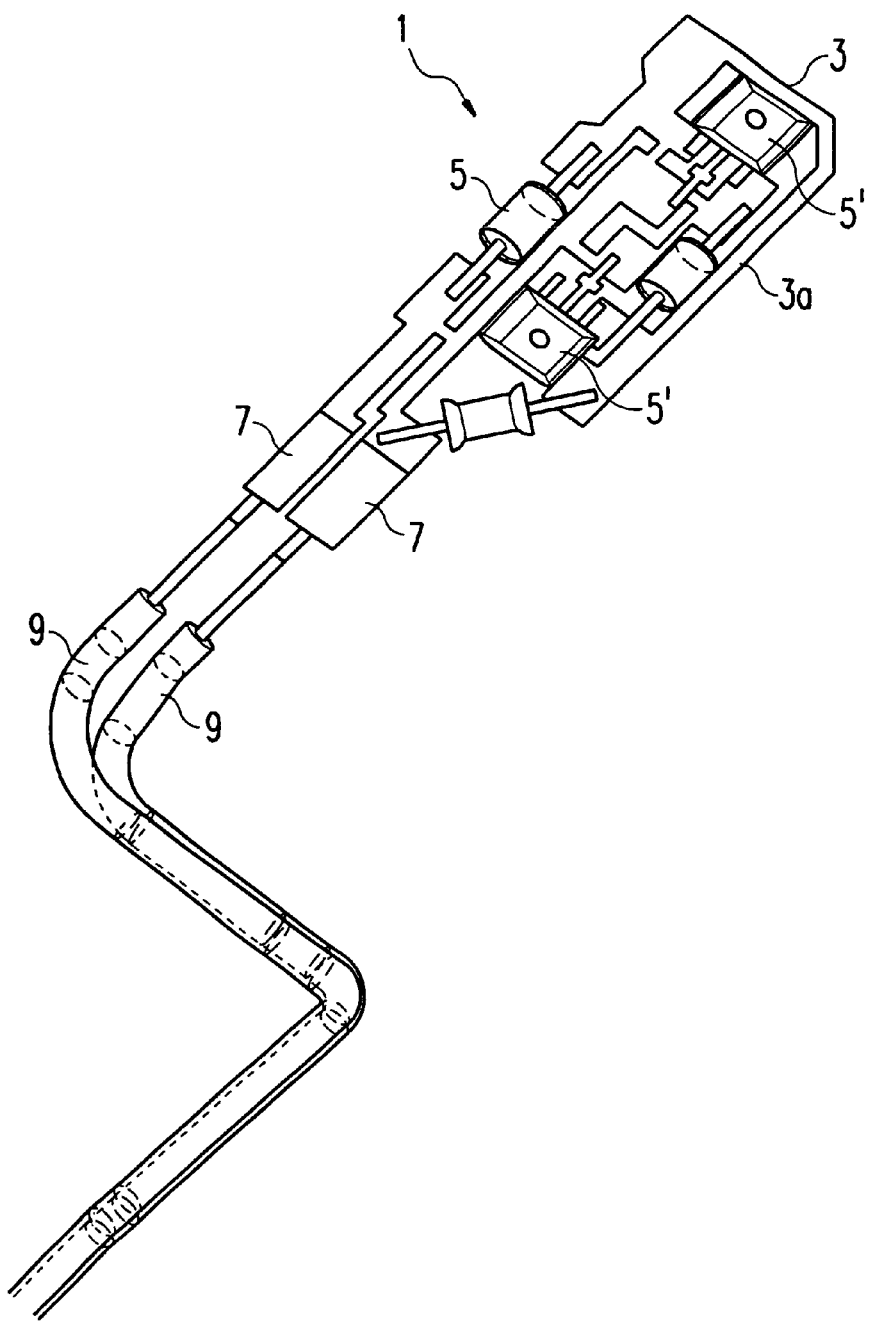
FIG. 1 shows a perspective view of an electronic module formed in accordance with one embodiment of the invention, that includes a circuit board and electronic components arranged thereupon.

With initial reference to FIG. 1, an electronic module 1 includes a stamped grid circuit board 3 having individual circuit-board conductors 3a disposed thereupon. One or more components 5, e.g. electronic components, electro-mechanical components, and/or the like, are operatively arranged on the circuit board 3. FIG. 1 depicts two exemplary Hall elements 5' which, in the illustrated embodiment, serve as position detectors for a detectable locking element of an automotive seat belt system.

The electronic module 1 includes a set of connection contacts 7 which are contacted by a corresponding set of associated electrical conductors of an electrical connection line 9.

Figure 2:
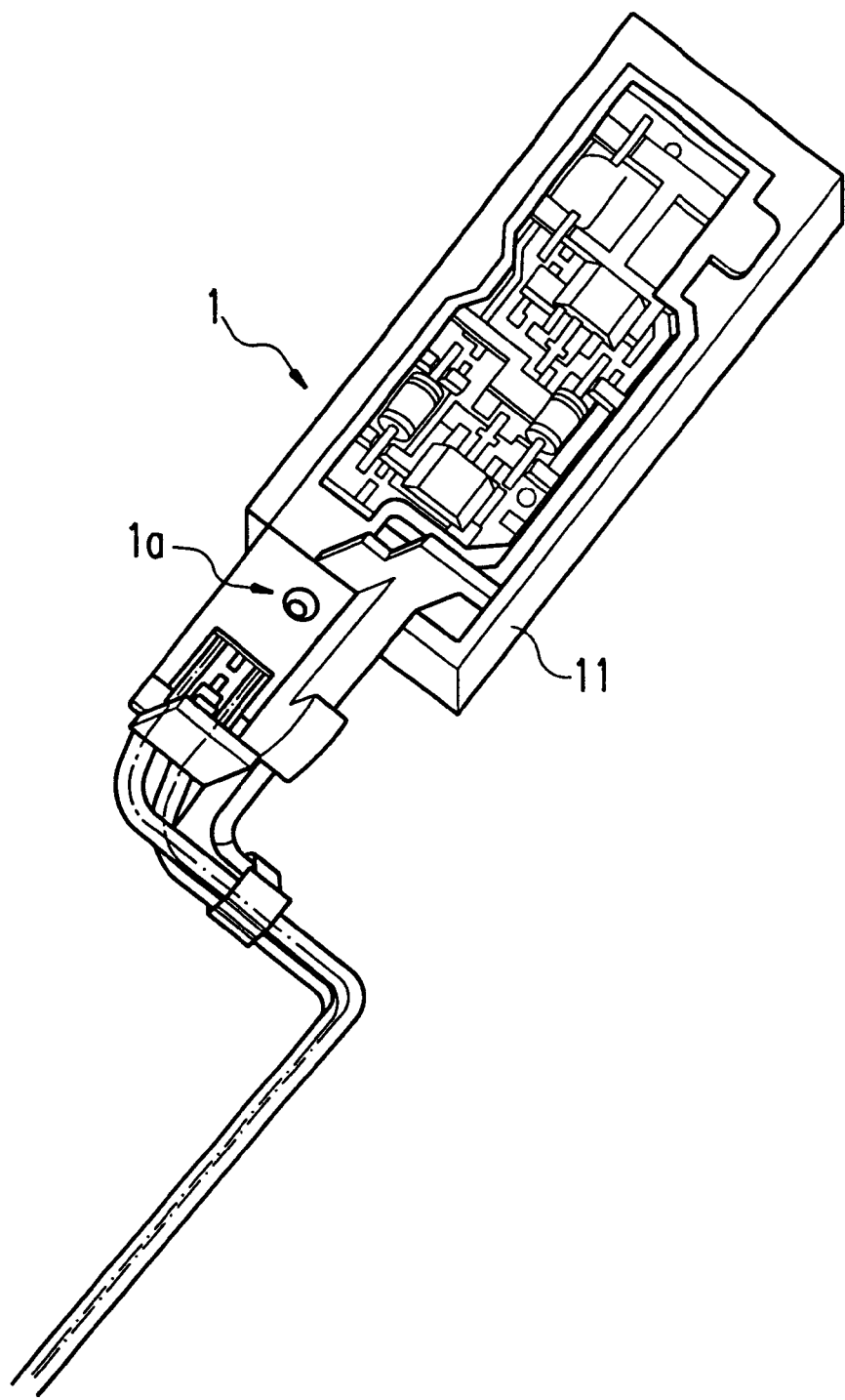
FIG. 2 shows a perspective view of the electronic module of FIG. 1 encased in a plastic material having a low Shore Hardness.

With reference now to FIG. 2, the electronic module 1 is shown partially encased within a covering 11 preferably formed of a plastic material with low Shore Hardness. The Shore Hardness of the plastic material preferably lies within a range of about 40 to 60 Shore.

As shown in FIG. 2, the casing 11 of relatively soft plastic material surrounds the entire anterior area of the electronic module 1. The layer above the Hall element 5' is preferably formed in such a manner that the Hall elements 5' are still able to detect the detectable locking element, at which is provided at least one magnet.

In an alternate embodiment, optical sensors (not shown) are employed. In this alternate embodiment, the plastic material is preferably sufficiently transparent at the relevant light wavelength to facilitate essentially unimpeded light detection operation by the optical sensors.

By encasing the printed circuit board 3 with the relatively soft plastic material, sufficient mechanical fixing occurs to enable further installation of the thusly encased electronic module is one or more subsequent manufacturing steps. However, the electronic module 1 encased in the soft plastic is still relatively unstable mechanically and remains flexible overall.

The relatively soft plastic material can be applied in many ways as desired. However, preferably, the soft plastic material is applied by spray-encasing the electronic module 1. Preferably, at least those areas of the electronic module 1 that include the electronic and/or electromechanical components 5 are encased in the layer of plastic. Preferably, the area 1a shown in FIG. 2 in the vicinity of the connection contacts 7 at which the connection lines 9 operatively attach remains free of applied soft plastic in order to provide in the area la a plug-in connection for the connection lines that includes a mating insert connector, sockets or the like.

Figure 3:
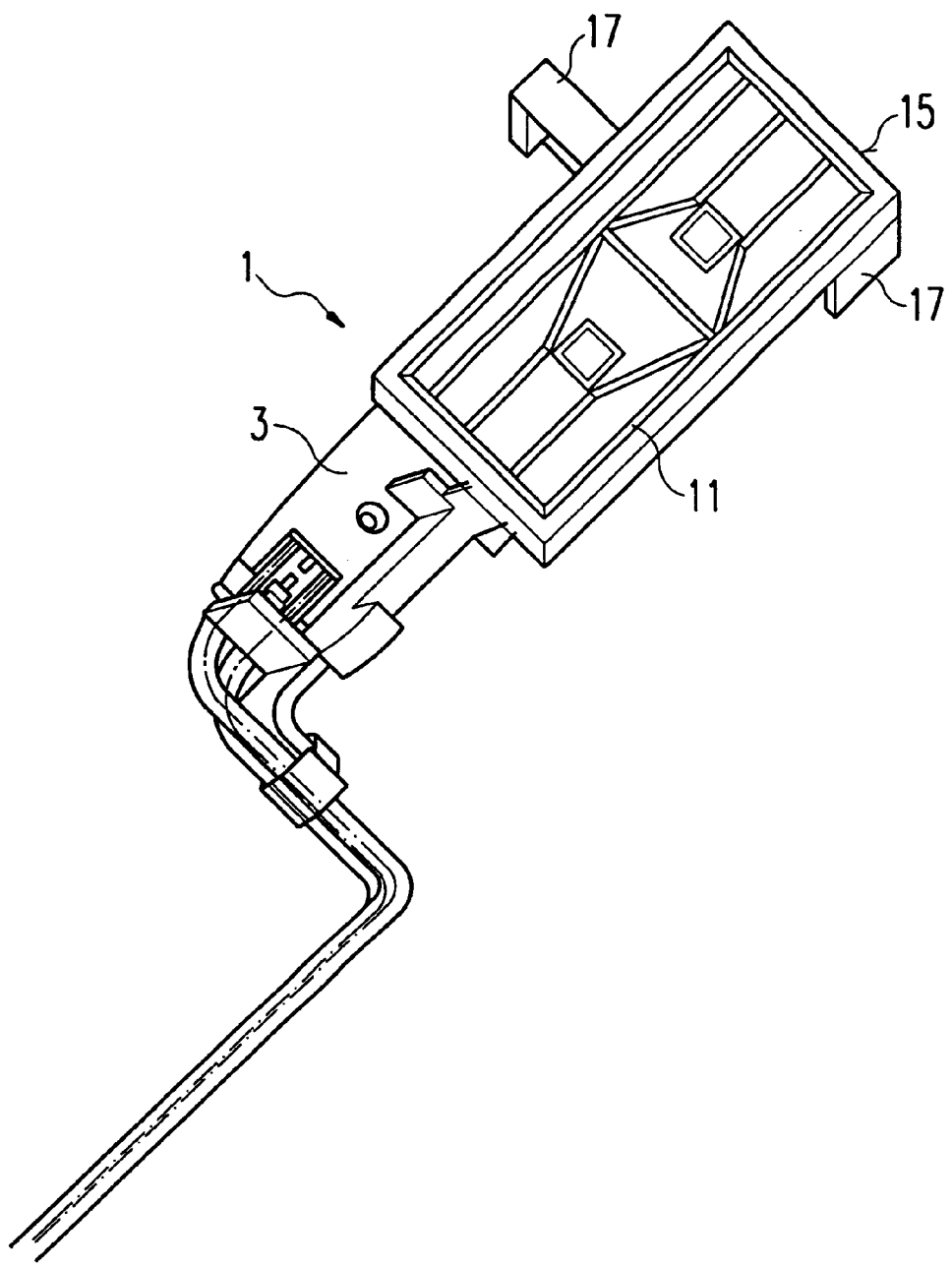
FIG. 3 shows a perspective view of the electronic module of FIG. 2 encased with an additional covering of a rigid plastic.

With reference now to FIG. 3, another embodiment is described. To manufacture the embodiment of FIG. 3, a module essentially similar to the embodiment of FIG. 2 is first produced, i.e. the electronic module of FIG. 1 is first surrounded with the plastic coating 11 of low Shore Hardness. Subsequently, the relatively soft plastic casing 11 is spray-coated with a coating 15 of rigid plastic material. Spray-coating is performed over partial areas or over the entire range as desired. A connection of the rigid coating 15 with the printed circuit board 3 or the components 5 is preferably avoided, at least to the extent possible, in order to form a resilient, shock-absorbing bedding for the electronic module.

Mounting elements 17 are selectively provided at the rigid coating 15 for installation of the electronic module 1 in a receiving element. The mounting elements 17 can be formed in any desired size or shape including, for example, snap-in locking elements or elements that can be connected by welding, e.g. by ultra-sound welding, with corresponding areas of the receiving element.

The embodiment of FIG. 3 thus enables extremely compact installation in a receiving element, said installation nonetheless providing impact protection and vibration protection. The embodiment of FIG. 3 can be appropriately pre-assembled and embedded in a state that protects against mechanical damage and vibrations, and then integrated into the receiving element. Moreover, in addition to protecting against purely mechanical vibrations and shocks, the soft plastic and/or soft-plus-hard plastic coating provides protection against other environmental influences such as moisture, corrosion, and the like.

A suitable material for the soft plastic coating is an elastomer with appropriate properties.

Figure 4:
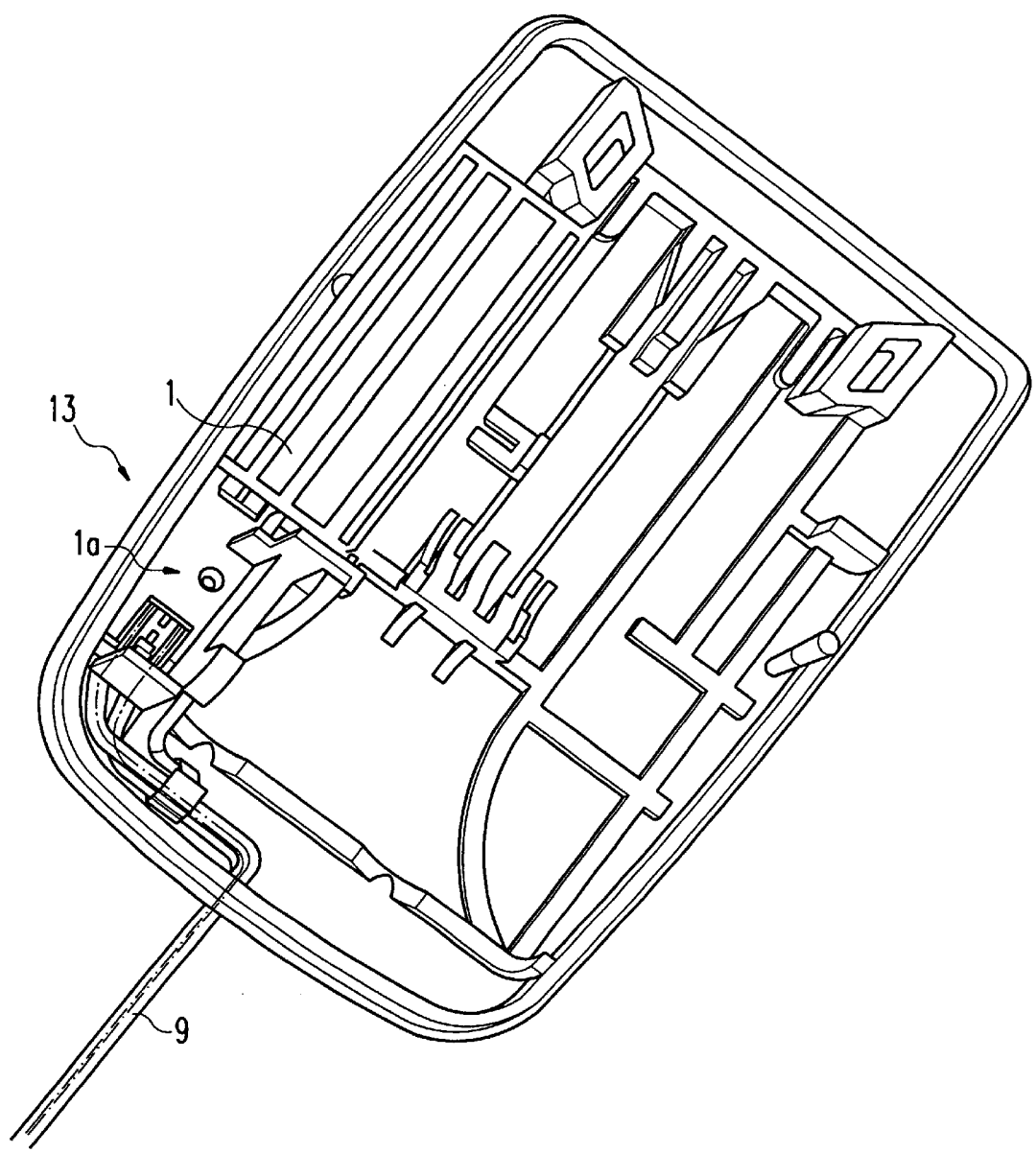
FIG. 4 shows a perspective view of a receiving element in the shape of an open half-dish portion of a seat belt buckle for a motor vehicle.

With reference now to FIG. 4, a receiving element 13 in the shape of a half-dish for a belt buckle includes therein an integrated electronic module 1, spray-coated with the relatively soft plastic layer according to FIG. 2. Manufacture of the receiving element 13 with the integrated electronic module 1 can also be performed as desired by directly spray-coating the electronic module 1, encased in soft plastic.

Fixing and/or retaining of the electronic module 1 within the receiving element 13 is preferably performed in such a manner that the electronic module 1 spray-coated with the relatively soft plastic layer is arranged within the receiving element 13 so that only the soft plastic coating 11 is covered by the rigid plastic. This results in an overall elastic, shock-absorbing bedding of the electronic module 1 in the receiving element 13.

As required, the electronic module is additionally surrounded in one or several areas by rigid material of the receiving element 13. In this case, however, it is important that the arrangement protects at least the components of the electronic module 1 from vibrations and mechanical shocks by providing support in a resilient but shock-absorbing manner. For example, the area 1a of the electronic module 1 can additionally be rigidly anchored in the receiving element 13.

Of course, the inventive plastic module is not only applicable in automotive engineering and in seat belt buckles therefor. Rather, the invention finds application and other uses where impact and vibration protected integration of an electronic module into a receiving element is required under extremely tight spatial constraints.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. An electronic module comprising:
    a plurality of electrical circuit board conductors;
    a plurality of components operatively connected with the plurality of circuit board conductors;
    at least one electrical connection contact operatively connected with the plurality of circuit board conductors; and a soft plastic material surroundingly disposed about at least a portion of the plurality of circuit board conductors and surroundingly disposed about at least a portion of the plurality of components, and a rigid plastic material surroundingly disposed about and in continuous contact with the soft plastic material.

2. The electronic module as set forth in claim 1, wherein:

the plurality of electrical circuit board conductors include one of a stamped grid and a printed conductor plate; and the plurality of components operatively connected with the plurality of circuit board conductors include a plurality of components mechanically attached to the plurality of electrical circuit board conductors.

3. The electronic module as set forth in claim 1, wherein the electronic module is mechanically flexible overall.

4. The electronic module as set forth in claim 1, wherein at least a portion of the soft plastic material cooperates with an associated receiving element to create one of positive and non-positive connection of the electronic module with the associated receiving element.

5. The electronic module as set forth in claim 1, wherein at least a portion of the rigid plastic material cooperates with an associated receiving element to create one of positive and non-positive connection of the electronic module with the associated receiving element.

6. The electronic module as set forth in claim 1, wherein the plurality of components include components selected from the group consisting of electronic components, electro-mechanical components, and optical sensors.

7. An apparatus comprising, in combination:

an electronic module including:

an electrical circuit board conductor;

a component operatively connected with the circuit board conductor, at least one electrical connection contact operatively connected with the circuit board conductor, and, a soft plastic material surroundingly disposed about at least a portion of the circuit board conductor and surroundingly disposed about at least a portion of component, a rigid plastic material surroundingly disposed about the module in continuous contact with the soft plastic material in at least the region in which the soft plastic material is provided; and, a receiving element adapted to retain the electronic module in one of a positive and a non-positive fashion.

8. The apparatus as set forth in claim 7, wherein the electronic module further includes an attachment area cooperative with the receiving element to retain the electronic module therein.

9. The apparatus as set forth in claim 7, wherein at least one mounting element is formed by the rigid plastic material, said mounting element cooperating with the receiving element to retain the electronic module therein.

10. An electronic module comprising:

a plurality of electrical circuit board conductors;

a plurality of components operatively connected with the plurality of circuit board conductors;

at least one electrical connection contact operatively connected with the plurality of circuit board conductors; and a soft plastic material surrounding at least a portion of the plurality of circuit board conductors, at least a portion of the plurality of components, and at least the anterior area of the electronic module.

11. An electronic module comprising:

a circuit board having a plurality of electrical circuit board conductors disposed thereupon;

a plurality of components operatively connected with the plurality of circuit board conductors;

at least one electrical connection contact operatively connected with the plurality of circuit board conductors;

a soft plastic material encasing at least a portion of the circuit board; and a rigid plastic material surroundingly coating at least a portion of the soft plastic material.

* * * * *